(12) United States Patent
Russell

(10) Patent No.: US 9,107,330 B2
(45) Date of Patent: *Aug. 11, 2015

(54) APPARATUS FOR IMPROVED POWER DISTRIBUTION IN AN ELECTRICAL COMPONENT BOARD

(71) Applicant: R&D Sockets, Inc., Allentown, PA (US)

(72) Inventor: James V Russell, New Hope, PA (US)

(73) Assignee: R&D Sockets, Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/120,152

(22) Filed: Apr. 30, 2014

(65) Prior Publication Data

US 2014/0268613 A1 Sep. 18, 2014

Related U.S. Application Data

(63) Continuation of application No. 12/655,834, filed on Jan. 8, 2010, now Pat. No. 8,743,554.

(60) Provisional application No. 61/276,661, filed on Sep. 15, 2009.

(51) Int. Cl.

| | |
|---|---|
| H05K 7/10 | (2006.01) |
| H05K 7/12 | (2006.01) |
| H05K 3/30 | (2006.01) |
| H01L 23/498 | (2006.01) |
| H01L 23/50 | (2006.01) |
| H05K 1/02 | (2006.01) |
| H05K 1/14 | (2006.01) |
| H05K 1/11 | (2006.01) |
| G01R 1/073 | (2006.01) |
| H01L 23/00 | (2006.01) |
| H05K 1/18 | (2006.01) |

(52) U.S. Cl.
CPC ............ *H05K 3/30* (2013.01); *H01L 23/49827* (2013.01); *H01L 23/49838* (2013.01); *H01L 23/49866* (2013.01); *H01L 23/50* (2013.01); *H05K 1/0231* (2013.01); *H05K 1/0234* (2013.01); *H05K 1/0298* (2013.01); *H05K 1/111* (2013.01); *H05K 1/141* (2013.01); *G01R 1/07378* (2013.01); *H01L 24/13* (2013.01); *H01L 2924/01057* (2013.01); *H01L 2924/01078* (2013.01); *H05K 1/0213* (2013.01); *H05K 1/185* (2013.01); *H05K 2201/049* (2013.01); *H05K 2201/10378* (2013.01); *H05K 2201/10636* (2013.01); *Y10T 29/4913* (2015.01)

(58) Field of Classification Search
USPC .................. 361/760–784, 790, 792–795, 803
See application file for complete search history.

(56) References Cited

U.S. PATENT DOCUMENTS

| | | | |
|---|---|---|---|
| 7,766,667 | B2 | 8/2010 | Russell |
| 7,931,476 | B2 | 4/2011 | Russell |
| 8,066,517 | B2 | 11/2011 | Russell |

*Primary Examiner* — Tuan T Dinh
(74) *Attorney, Agent, or Firm* — Richard B. Klar; Law Office Richard B Klar

(57) ABSTRACT

Embedding a power modification component such as a capacitance inside of an adaptor board located to extend over and beyond the vias of the main circuit board so that a portion of the interposer board containing the embedded capacitance is located beyond where the vias or blinds are located. This permits that via to conduct through the opening. In this way, the capacitance and the resistance will have a closer contact point to the electrical component. A resistance can also be embedded in an opening in the adaptor board and be vertically aligned within the opening to make contact with a pad on top of the adaptor board and a pad at the bottom of the adaptor board so that electricity conducts through the embedded component.

8 Claims, 8 Drawing Sheets

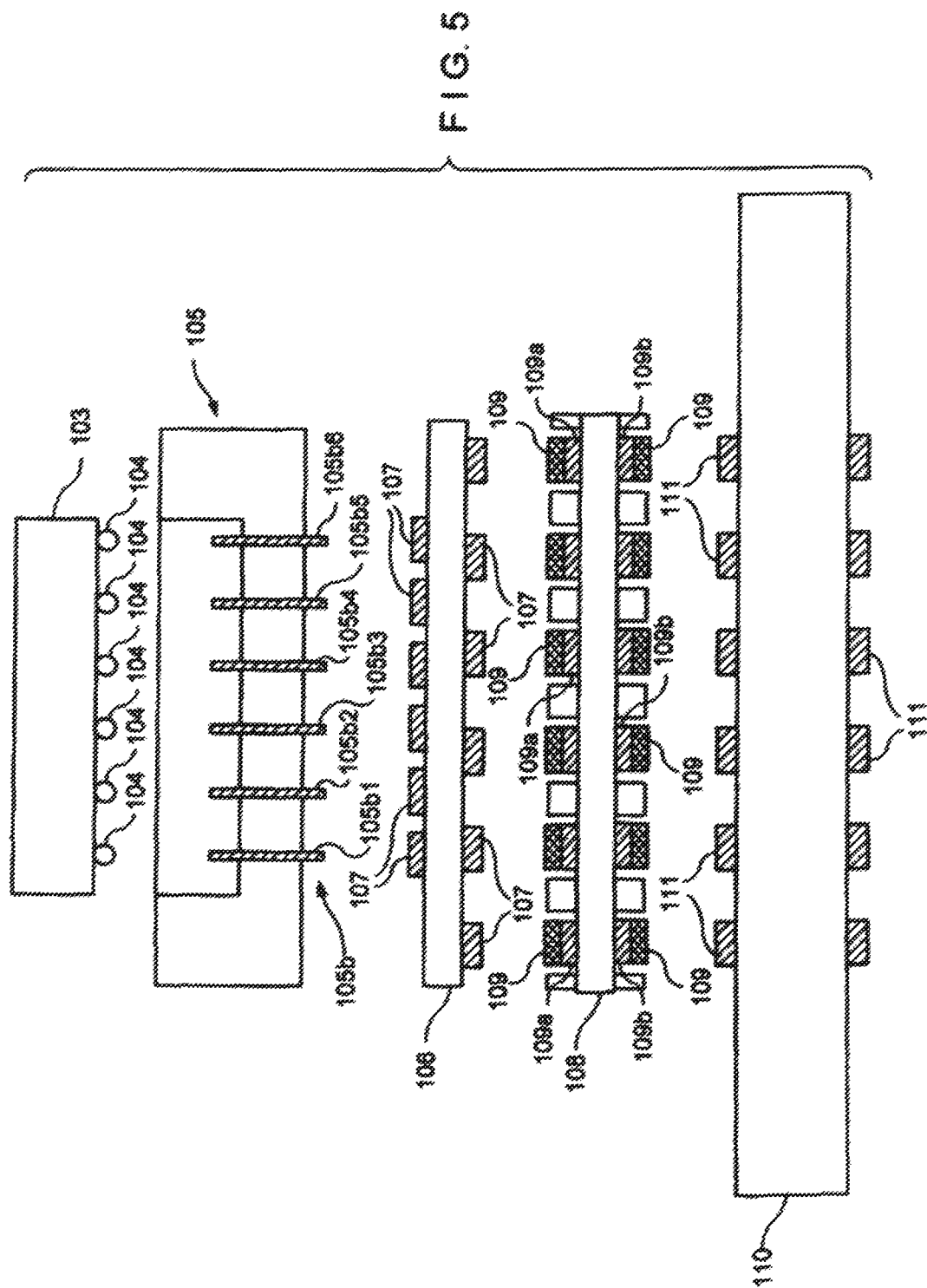

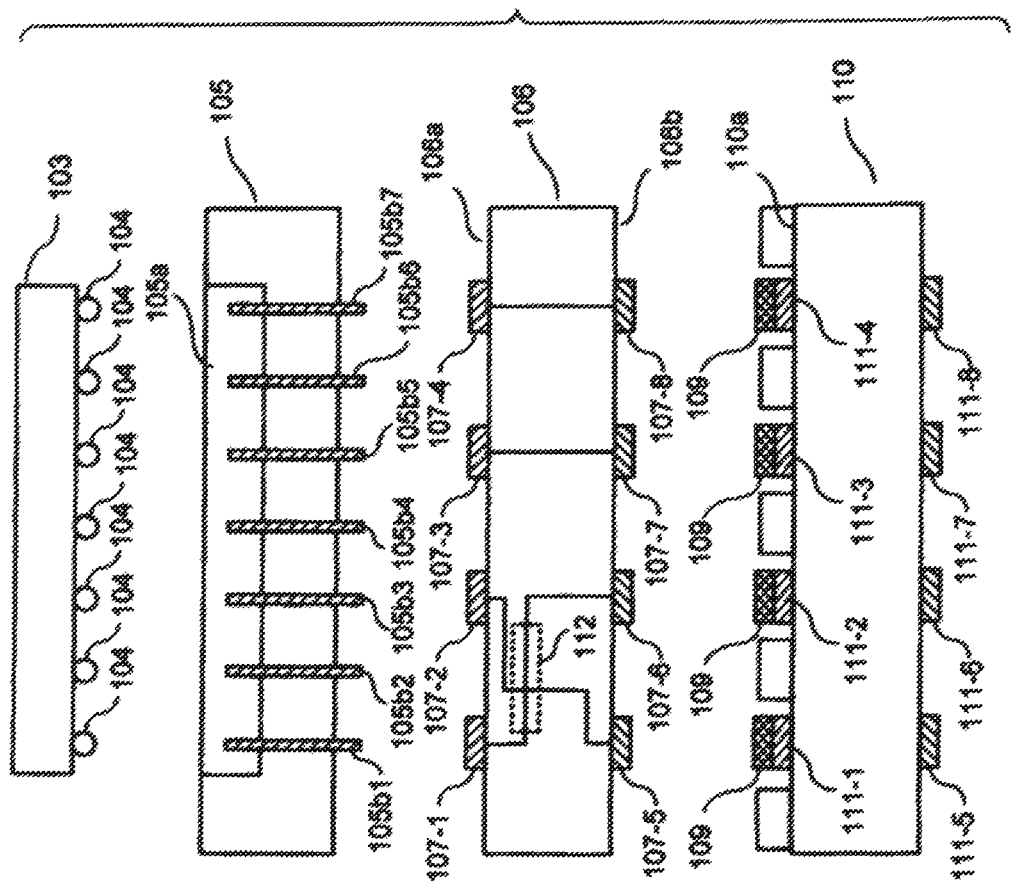

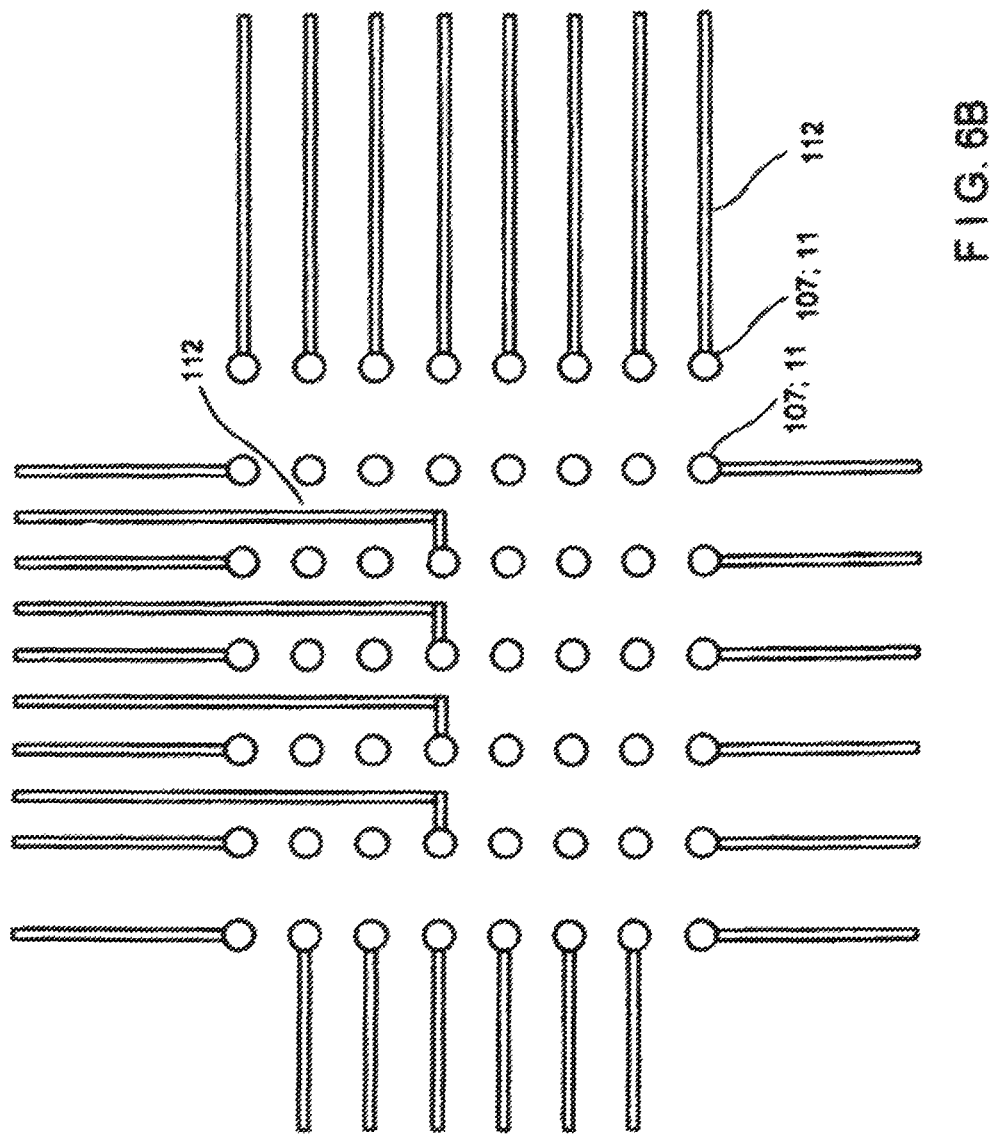

APPARATUS FOR IMPROVED POWER DISTRIBUTION IN AN ELECTRICAL COMPONENT BOARD

RELATED APPLICATIONS

This is a continuation application under 35 USC 120 of non provisional application Ser. No. 12/655,834 filed on Jan. 8, 20112 which in turn is a non provisional application of a provisional application Ser. No. 61/276,661 by James V Russell filed Sep. 15, 2009.

BACKGROUND

1. Field

In attaching an electrical component to the bottom side and/or the top side of a printed circuit board (PCB), there is the problem of power loss due to the distance of the capacitance to the points on a corresponding IC for which it is intended. It is not possible to physically locate the capacitance directly to the contact pads on the printed circuit, which corresponds to the input output points of an integrated circuit or, in the case of a test board, the corresponding points of the test socket. Similarly, there is the problem of inadequate power dissipation due to the distance of a resistance to the electrical component. Again, it is not very likely to physically locate the resistance at the contact pads on the printed circuit board.

It would therefore be desirable to have a method and apparatus that provides for close proximate placement of the capacitance or of the resistance, which shall be referred to as a power modification component, since it either dissipates power (resistance) or better distributes power (capacitance) to the electrical component on a PCB to provide better power distribution or power dissipation. It would be even more desirable to be able to accomplish these goals without the need for replacing the main circuit board should a different circuit be desired at another time.

SUMMARY

The present disclosure provides for attaching and embedding a capacitance or a resistance directly in an adaptor board or an interposer board that is then connected to the main circuit board. The adaptor board can be connected to the main circuit board by soldering, electrically connecting it by a conductive elastomer connection, spring pins or by any other way that is known in the art.

BRIEF DESCRIPTION OF THE DRAWINGS

FIG. 5 is an exploded sectional view of another embodiment of the present disclosure;

FIG. 6A is an exploded sectional view of another embodiment of the present disclosure in which the number of pads is different from that of the embodiments of FIGS. 5, 8 and 9;

FIG. 6B illustrates the trace routing on one of either the interface sides of the main circuit board or of the adaptor board facing a side of the modified printed circuit board (modified pc board) where the trace routing is possible on the interface layers of the adaptor board and on the interface layers on the main circuit board in accordance with the embodiments of FIG. 5, FIG. 6A, FIG. 8 and FIG. 9 of the present disclosure;

FIG. 8 is another embodiment of the present disclosure in which there is no need for a modified PC board and the adaptor board has lands that are coated with conductive elastomeric material; and.

DETAILED DESCRIPTION OF THE PREFERRED EMBODIMENT(S)

Figure 1:
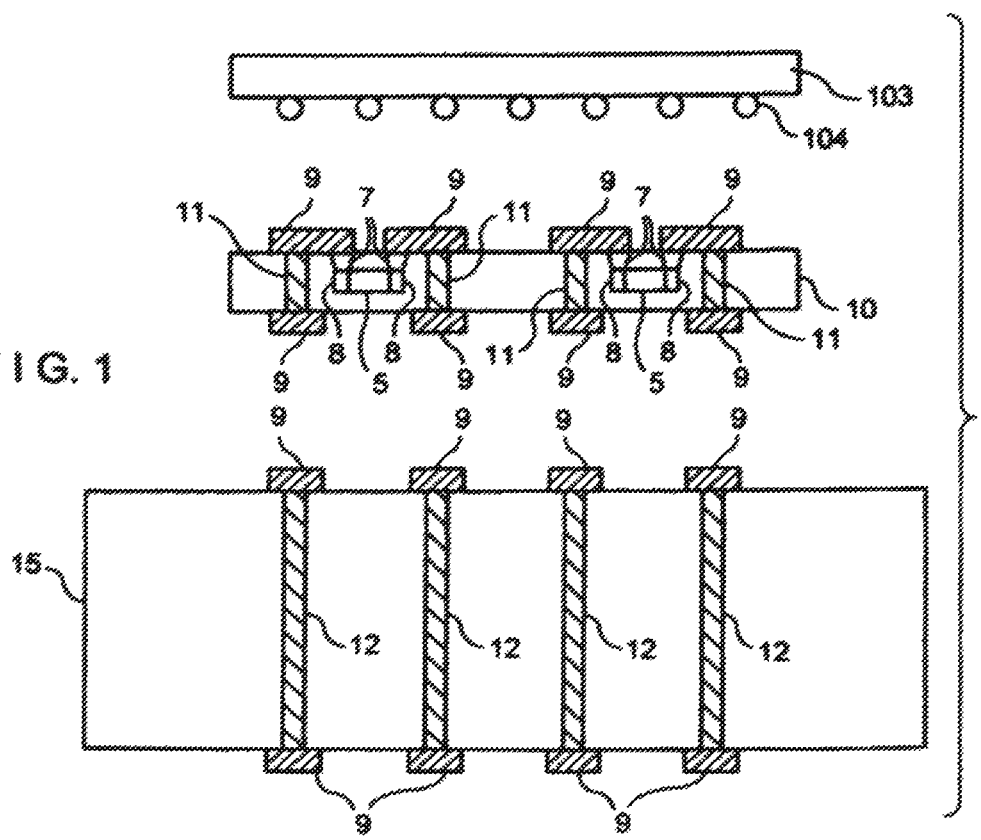
FIG. 1 is an exploded sectional view showing embedded components in an interposer board, which is located above for connection to the main circuit board in accordance with the present disclosure.

Referring to the drawings, FIG. 1 shows an embodiment of the present disclosure in which power modification component 5 is embedded in an adaptor board 10. The embedded component 5 can be placed between vias 11 as shown in FIG. 1. In FIG. 1, an embedded component 5 is placed between extended pads on the top of an adaptor board 10 with the component 5 embedded within the adaptor board 10. Connective material 7 is conductive material such as but not limited to solder, conductive epoxy or traditional plating techniques such as copper, silver, etc. connecting the ends 8 of the component 5 to the underside of extended pads 9A. Similarly, vias 11 can be made through metallization by any traditional plating techniques such as copper, silver, etc., conductive epoxy, or solder. Thus the extended pads 9A are connected to the ends 8 of the component 5 by conductive material 7 and are offset from the vias 11 extending through the adaptor board 10 before making contact with the vias 12 of the main circuit board 15, which is attached or connected to the adaptor board 10. In this way, the main circuit board 15 can be reused and does not have to be discarded when an embedded component 5 wears out or the main circuit board 15 is used for another circuit configuration. Main circuit boards 15 are expensive and this is a practical way to reduce the power loss (dissipation) from a resistor (see FIGS. 3 and 4) or improve a power gain (distribution) for a capacitance by using embedded components 5 but still freeing the main circuit board 15 for future use at the same time. The adaptor board 10 can be connected to the main circuit board 15 in any conventional way including soldering to it, connecting to it by use of a conductive elastomeric connection or spring pins or any other way that is know in the art.

Figure 2:
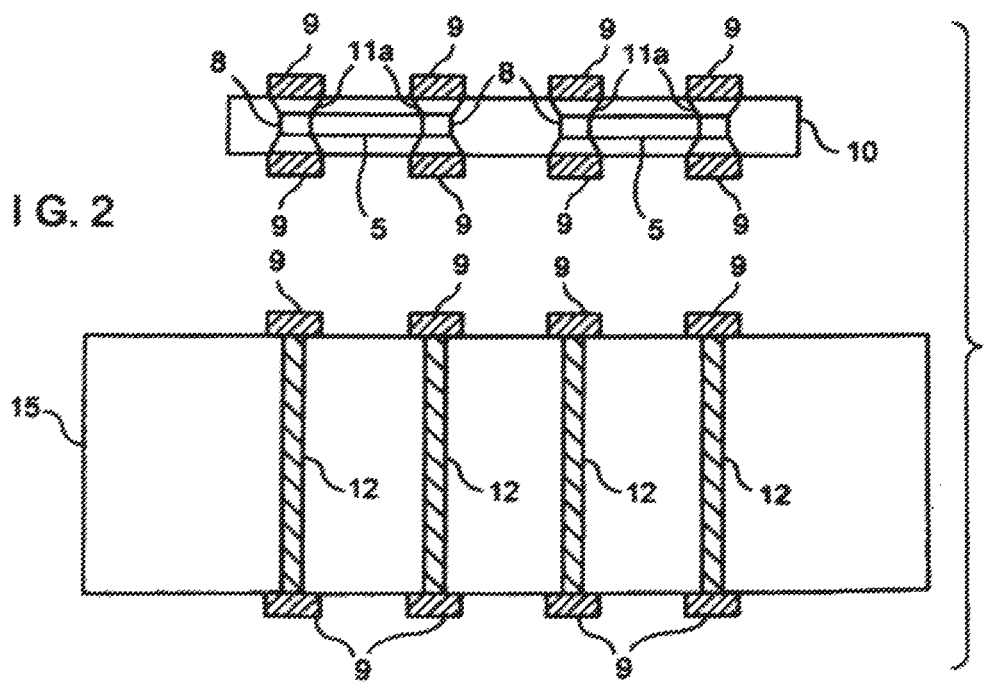
FIG. 2 is another embodiment of the present disclosure showing the vias aligned vertically one on top of another for a finer pitch.

FIG. 2 shows another embodiment of the present disclosure in which a finer pitch is possible by aligning blinds 11a on top of one another. In this embodiment, rather than have the pads of the interposer board extend and be offset from the vias 11 as in FIG. 1 blinds 11a are vertically aligned with one set extending to permit the pads to make contact with the endpoints of the embedded component 5 from the top of the adaptor board 10 and with another set extending upward from the pads at the bottom of the adaptor board 10. In this way a finer pitch is possible. Blinds 11*a* can be connected to the endpoints as described for connective material 7 for the embodiment in FIG. 1.

Figure 3:
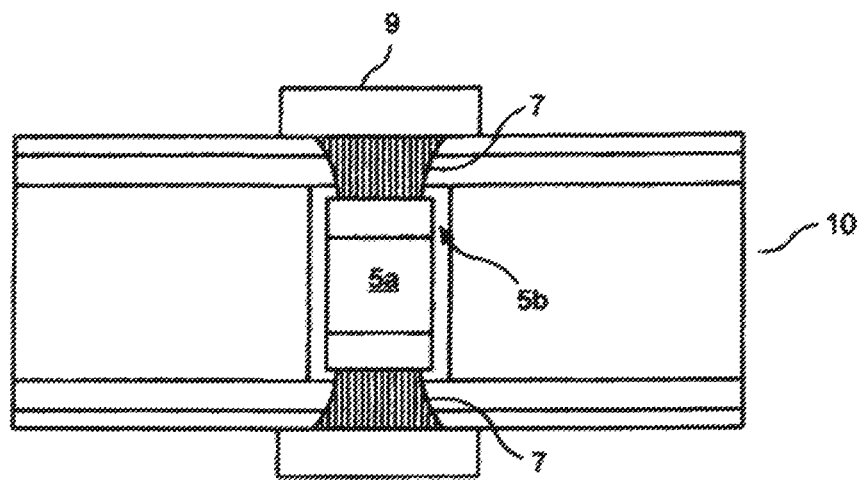
FIG. 3 is another embodiment of the present disclosure in which the embedded component is aligned vertically within the adaptor board.

FIG. 3 shows another embodiment of improved power dissipation by embedding a resistor 5*a* in an adaptor board 10. Component 5*a* is located between pads 9*a* and 9*b* and in effect acts as a via for the adaptor board 10 so that the electrical connection is through the resistance 5*a* embedded in the adaptor board 10. The pads 9 are connected to the resistance 5*a* through openings at the end points of resistance 5*a* and pads 9*a* and 9*b* respectively. The openings can be filled with solder, metallic plating or conductive epoxy. It is understood that the adaptor board 10 can be a multilayer PC board.

Figure 4:
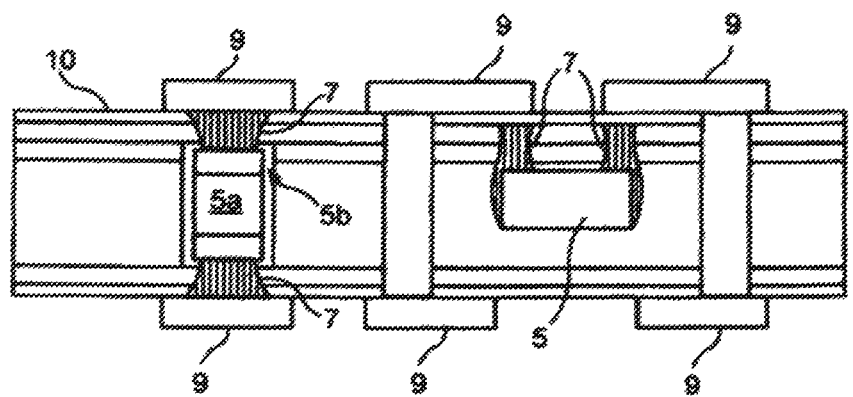
FIG. 4 is an embodiment of the present disclosure showing an embedded resistance and an embedded capacitance within the adaptor board.

FIG. 4 shows another embodiment of the present disclosure with the embedded component 5 of FIG. 1 and the embedded resistance 5*a* of FIG. 3 together in the same adaptor board 10. It is understood that the adaptor board 10 can be a multilayer PC board.

FIG. 5 illustrates the electrical connector of the present disclosure in which the connector has a mechanical compression structure 105, an adaptor board 106 (it is understood that the adaptor board has embedded components in it not shown in FIG. 5) with connecting lands or pads 107, and a modified PC board 108 with conductive elastomer material 109 formed on lands 109*a* and 109B respectively on both sides of the modified PC board 108; and a main circuit board 110 having connecting lands 111. One non-limiting illustrative example of use of the compression structure 105 for the present disclosure includes a socket 105*a* in the compression structure 105 that is adapted to house a test circuit such as an integrated circuit (IC) chip 103. Pins 105*b* provide for making electrical connections to the IC chip 103 housed in socket 105*a* with pads 107 of the adaptor board 106. The connecting lands or pads 107 of the adaptor board 106 and of the connecting lands 111 of the main circuit board 10 are placed into contact with elastomer material 109 located on the lands or pads 109*a* and 109*b* of the modified PC board 108 when the adaptor board 106 and the modified PC board 108 and the main circuit board 110 are compressed together by the mechanical compression structure 105. The elastomer material 109 can be either isotropic or anisotropic elastomer material. Thus the modified PC board 108 by placement of the elastomeric material 109 thereon serves as a pad defined connector 108. Alternatively, the modified PC board 108 can be replaced with an anisotropic sheet elastomer.

By compressing the boards together, it is possible to provide an electrical connection between the adaptor board 106 and the main circuit board 110 thereby adapting the pitch and/or footprint between the compression structure 105 and the main circuit board 110. By using lands on both sides of the modified PC board 108, a good connection is established be only placing conductive elastomeric material including but not limited to placing isotropic elastomeric material at pad locations or by placing anisotropic material throughout the entire surface of the connecting region as described in U.S. Pat. No. 6,854,985. An advantage of utilizing isotropic elastomeric material at pad locations is that great routing densities and low costs can be realized.

In addition to converting the pitch by connecting fine pads to coarse pads and vice verse, also known as pitch translation the present disclosure also provides for rerouting the electrical connections from the pins 105*b*1-6 connected to the connection points 104 of the test circuit (such as an IC chip 103) housed in the socket 105*a* of the mechanical compression structure 105 to the pads 109 of the adaptor board 106 and to the pads 111 of the main circuit board 110 also known as pin map scrambling. As shown in FIG. 6A, the adaptor board 106 can be rerouted so that its electrical pathway 112 does not have to connect to the corresponding land or pad 111 on the main circuit board 110 nor does it need to translate pitch. Thus pin 105*b*-1 on structure 105 can be connected to pad 107-1 on a first side 106*a* of the adaptor board 106 and pad 107-1 is rerouted via electrical pathway 112 to connect to the pad 107-6 rather than the first land 107-5 on the second side 106*b* of the adaptor board 106. The pad 107-6 is then connected to the pad 111-2 on the opposing surface 110*a* of the main circuit board 110. Any possible re-routing can be effected in this way. In this way the present disclosure permits re-routing of circuitry as desired. In addition the numbers of pads for the adaptor board 106 and for the main circuit board 110 can vary as needed. In addition, in this embodiment of FIG. 6A, there is no need for a modified PC board 108 as in FIG. 5 as is also the case in the embodiment of FIG. 9.

FIG. 6B illustrates one possible illustration of an enhanced trace routing 112 of the present disclosure known as pin map scrambling. As a result of the placement of the conductive elastomeric lands 109 on each side of the modified PC board 108 trace routing 112 is possible in and around connecting land arrays on interface layers between the modified PC board 108 and the adaptor board 106 and between the modified PC board 108 and the main circuit board 110. The modified PC board is not shown in the illustration of FIG. 6A. It is understood that this feature of the re-routing of the adaptor board 106 works for the embodiments of FIGS. 5, 6*a*, 8 and 9.

Figure 7:
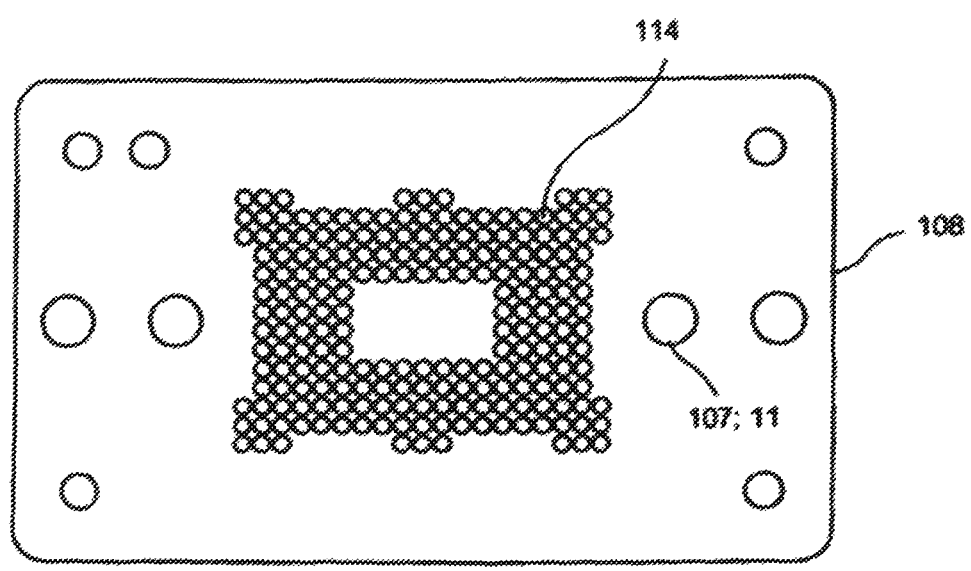
FIG. 7 is the modified PC board of the embodiment of FIG. 5.

FIG. 7 illustrates a possible embodiment according to the present disclosure of the modified PC board 108. The PC board 108 is modified by placing lands with isotropic material on both surfaces of the PC board 108 as shown. While FIG. 7 shows one surface, it is understood that the other surface is similarly arranged. The elastomeric material can be elastomeric paste placed on pads on both sides of the modified PC board 108.

Figure 8:
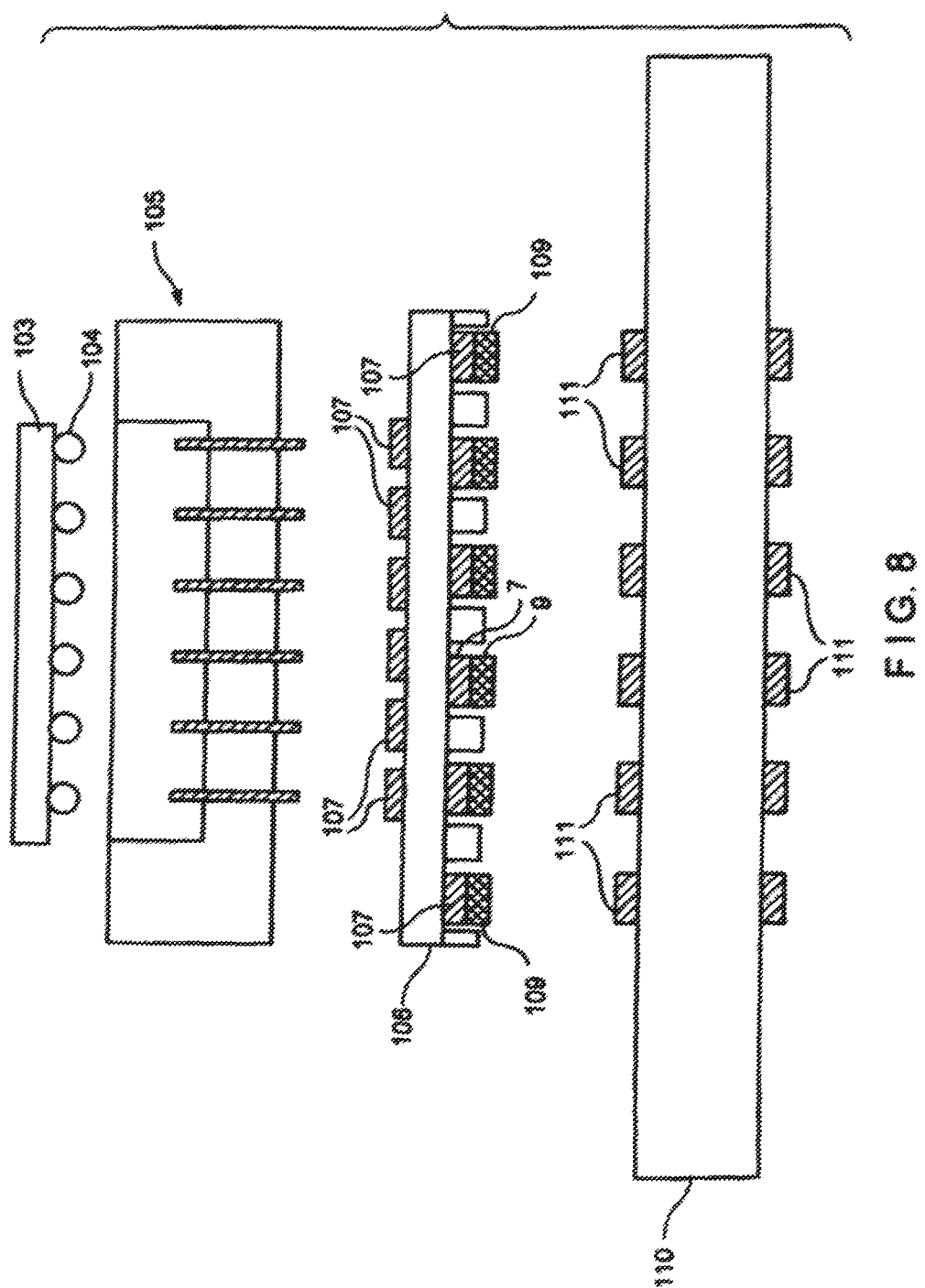

FIG. 8 illustrates a second embodiment in which there is no need for a modified pc board 108 between the adaptor board 106 and the main circuit board 10. Instead the lands 107*b* on the surface of the adaptor board 106 facing the lands 111*a* of the main circuit board 110 are coated with a conductive elastomeric material 109. Thus, instead of coating the pads 109*a* and 109*b* respectively of a modified PC board 108, as was the case in FIG. 5 of the present disclosure, the lands 107*b* of the adaptor board 106 facing the lands 111*a* of the main circuit board 110 are coated with the elastomeric material 109.

Figure 9:
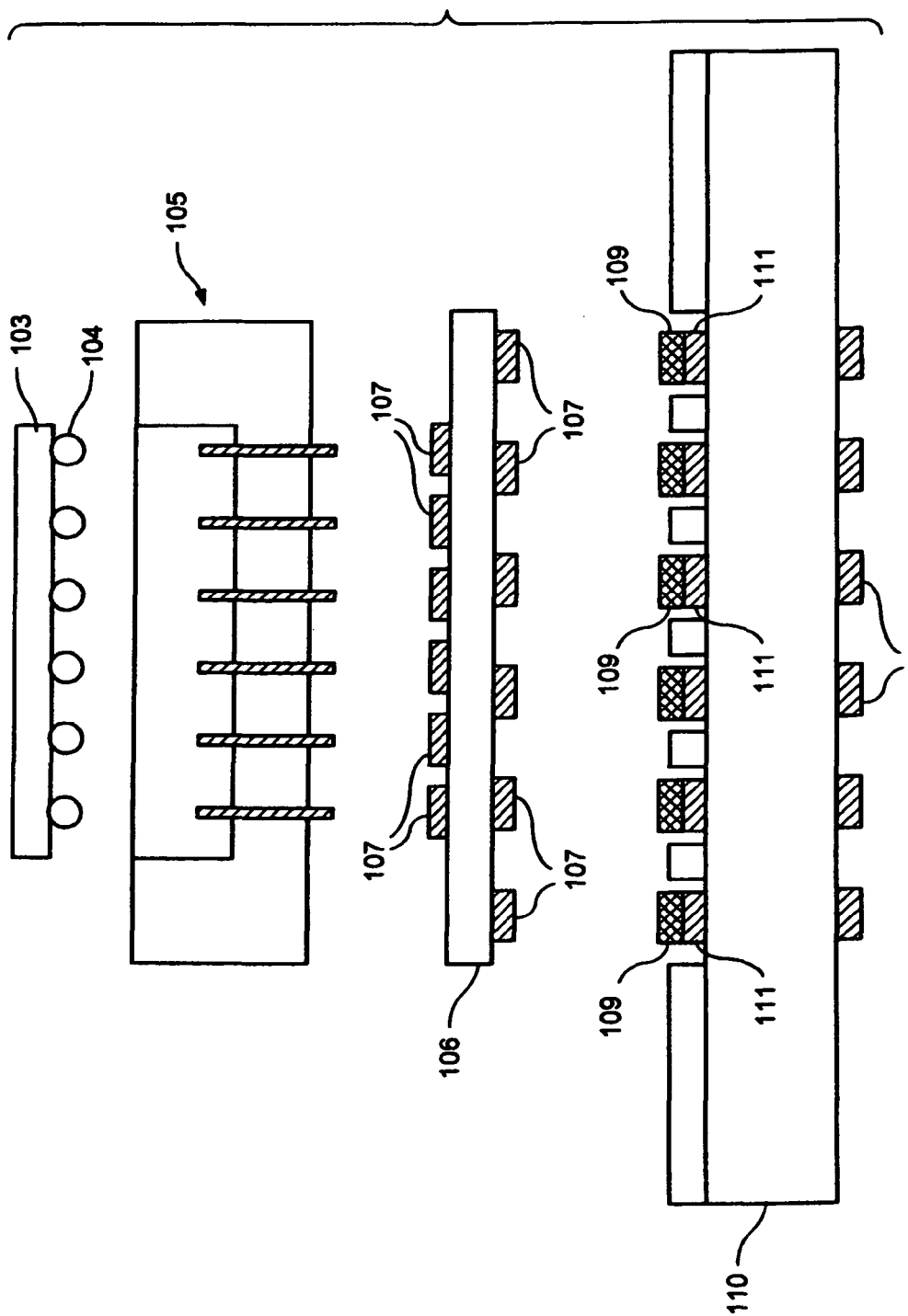
FIG. 9 is another embodiment of the present disclosure in which there is no need for a modified PC board and the main circuit board has lands that are coated with conductive elastomeric material.

FIG. 9 illustrates a third embodiment in which there is no need for a modified PC board 108 between the adaptor board 106 and the main circuit board 110. Instead the lands 111*a* on the surface of the main circuit board 110 facing the lands 107*b* of the adaptor board 106 are coated with a conductive elastomeric material 109. Thus, instead of coating the pads 109*a* and 109*b* respectively of a modified PC board 108, as was the case in FIG. 5 of the present disclosure, the lands 111*a* of the main circuit board 110 facing the lands 107*b* of the adaptor board 106 are coated with the elastomeric paste 109.

While certain embodiments have been shown and described, it is distinctly understood that the invention is not limited thereto but may be otherwise embodied within the scope of the appended claims.

The invention claimed is:

1. An apparatus for improved power distribution or power dissipation to an electrical component attached to a main circuit board, comprising:
   one or more power modification components embedded inside of at least one adaptor board between vias of said adaptor board, said one or more power modification components having terminals in electrical contact with a pad of said adaptor board, said pad having defined an anisotropic conductive elastomer thereon so that electricity conducts through said one or more power modification components to place said one or more power modification components close to said electrical component to reduce an electrical length between the one or more power modification components and said electrical component thereby reducing inductance, said pad defined anisotropic conductive elastomer is with a compression stop;

said adaptor board being sandwiched between an electrical component and the main circuit board and said adaptor board being connected or attached to the main circuit board;

said one or more embedded components being located so as to extend over and beyond the vias or blind vias of said main circuit board so that a portion of the adaptor board containing the embedded power modification component is located beyond where the vias or blind vias are located to permit that via to conduct through the opening so that said power modification component is at a closer contact point to said electrical component thereby increasing power distribution or power dissipation, respectively.

2. The apparatus according to claim 1 wherein said power modification component is a capacitor.

3. The apparatus according to claim 1 wherein said power modification is a resistor.

4. The apparatus according to claim 1 wherein a conductive elastomer provides an electrical connection between said adaptor board and said main circuit board wherein said elastomer is located on at least one surface of said main circuit board.

5. The apparatus according to claim 1 wherein said pad defined anisotropic elastomer provides an electrical connection between said adaptor board and said main circuit board.

6. The apparatus according to claim 1 wherein said adaptor board which is embedded with said one or more power modification components is soldered to the main circuit board.

7. The apparatus according to claim 1 wherein said adaptor board is a multilayer board.

8. The apparatus according to claim 1 wherein said adaptor board is a two sided pc board.

* * * * *